(12) United States Patent
Hara et al.

(10) Patent No.: US 9,102,284 B2
(45) Date of Patent: Aug. 11, 2015

(54) ELECTRICAL JUNCTION BOX

(75) Inventors: Yasuhiro Hara, Makinohara (JP);
Takuya Nakayama, Makinohara (JP);
Mitsuru Saito, Makinohara (JP)

(73) Assignee: Yazaki Corporation, Tokyo (JP)

( * ) Notice: Subject to any disclaimer, the term of this patent is extended or adjusted under 35 U.S.C. 154(b) by 134 days.

(21) Appl. No.: 13/528,919

(22) Filed: Jun. 21, 2012

(65) Prior Publication Data

US 2012/0327618 A1    Dec. 27, 2012

(30) Foreign Application Priority Data

Jun. 21, 2011   (JP) ................................ 2011-137134

(51) Int. Cl.
*H05K 7/02* (2006.01)
*B60R 16/023* (2006.01)

(52) U.S. Cl.
CPC .............. *B60R 16/0238* (2013.01); *H05K 7/02* (2013.01)

(58) Field of Classification Search
CPC ............................. H05K 7/02; B60R 16/0238
USPC .................. 361/752, 719, 736, 748; 174/15.2
See application file for complete search history.

(56) References Cited

U.S. PATENT DOCUMENTS

| | | | | |
|---|---|---|---|---|
| 4,150,658 A | * | 4/1979 | Woods | 126/522 |
| 4,729,061 A | * | 3/1988 | Brown | 361/719 |
| 4,871,884 A | * | 10/1989 | Hayashi | 174/560 |
| 5,023,752 A | * | 6/1991 | Detter et al. | 361/752 |
| 5,718,039 A | * | 2/1998 | Saida et al. | 29/846 |
| 5,872,333 A | | 2/1999 | Uezono et al. | |
| 5,880,524 A | * | 3/1999 | Xie | 257/704 |
| 2010/0202120 A1 | * | 8/2010 | Kita | 361/752 |

FOREIGN PATENT DOCUMENTS

| | | |
|---|---|---|
| CN | 201000933 Y | 1/2008 |
| CN | 101188351 A | 5/2008 |
| CN | 201282312 Y | 7/2009 |
| JP | 2001-068192 A | 3/2001 |
| JP | 2001-068193 A | 3/2001 |

OTHER PUBLICATIONS

Chinese Office Action dated Oct. 20, 2014 issued for corresponding Chinese Patent Application No. 201210212530.3.

* cited by examiner

*Primary Examiner* — Dion R Ferguson
*Assistant Examiner* — Mandeep Buttar
(74) *Attorney, Agent, or Firm* — Locke Lord LLP

(57) ABSTRACT

An electrical junction box 1 includes: a metallic substrate 24; a relay 25 mounted on a surface of the metallic substrate 24, and arranged lower than the metallic substrate 24; an upper cover 4 covering the metallic substrate 24, and arranged upper than the metallic substrate 24; a hole 17 opening on a surface of a ceiling wall 7 arranged parallel to the metallic substrate 24 of the upper cover 4; and a heat introducing tube 18 continued to an inner edge of the hole 17, and penetrating the metallic substrate 24.

9 Claims, 3 Drawing Sheets

ELECTRICAL JUNCTION BOX

CROSS REFERENCE TO RELATED APPLICATIONS

This application is related to three co-pending applications: "ELECTRIC JUNCTION BOX" filed even date herewith in the names of YASUHIRO HARA, TAKUYA NAKAYAMA and MITSURU SAITO which claims priority to Japanese Application No. 2011-137132 filed Jun. 21, 2011; "ELECTRIC JUNCTION BOX" filed even date herewith in the names of YASUHIRO HARA, TAKUYA NAKAYAMA and MITSURU SAITO which claims priority to Japanese Application No. 2011-137133 filed Jun. 21, 2011; and "Box Main Body" filed even date herewith in the names of YASUHIRO HARA, TAKUYA NAKAYAMA and MITSURU SAITO which claims priority to Japanese Application No. 2011-137135 filed Jun. 21, 2011; which applications are assigned to the assignee of the present application and all three incorporated by reference herein.

BACKGROUND OF THE INVENTION

1. Field of the Invention

The present invention relates to an electrical junction box mounted on a vehicle or the like as a moving object.

2. Description of the Related Art

Various electronic devices such as a head lamp, a tail lamp, a starter motor, and an air conditioner motor are mounted on a vehicle as a moving object.

A junction block is arranged at a proper position in a vehicle for supplying electric power to the various electronic devices. Various electric circuit units composed of fuses, relays or the like are gathered in the junction block.

Incidentally, because the junction box includes fuses, relays, or bus bars, the junction box is also referred as a fuse block, a relay box, or collectively referred to as an electrical junction box. In this embodiment, the fuse block, the relay box, and the junction block are collectively referred to as the electrical junction box.

A conventional junction box includes: a box main body; and an electric-power-distributing unit received in the box main body. The box main body is formed in a flattened box shape. The box main body includes: a lower cover; and an upper cover attached to each other for receiving the electric-power-distributing unit. The lower and upper covers are made of insulating synthetic resin, and molded by injection molding.

The electric-power-distributing unit includes: a printed wiring board; a plurality of connectors mounted on the printed wiring board; a fuse-holding portion holding a plurality of fuses mounted on the printed wiring board; and relays as a plurality of electric components mounted on the printed wiring board. A conductive pattern of the printed circuit board electrically connects terminals of the connectors with the fuses and the relays according to a predetermined pattern.

The connector is exposed outside of the box main body via a through-hole penetrating an outer wall of the box main body. At least one of the connectors is fitted with a connector attached to an end of a power source cable connected to a power source such as a battery or a power generator mounted on the vehicle. Other connectors are fitted with connectors attached to ends of a wiring harness connected to various electronic devices mounted on the vehicle.

The fuse-holding portion is exposed outside of the box main body via a through-hole penetrating an outer wall of the box main body. The fuse-holding portion holds a plurality of fuses. The relay is mounted on the printed wiring board, and received in the box main body.

In the above conventional electrical junction box, electric power supplied from the connector connected to the power source is distributed by a conductive pattern of the printed wiring board, and passed through the fuses and relays, and then supplied to various electronic devices via electric wires in the wiring harness.

SUMMARY OF THE INVENTION

Technical Problem

The above conventional electrical junction box may be mounted on a vehicle in a manner that an overlapping direction of the lower and upper covers is along a vertical direction, and the printed wiring board is positioned above the relay mounted on the printed wiring board. In this case, because the printed wiring board covers the relay, it is undesirable that the heat generated by the relay concentrates on the printed wiring board.

Accordingly, an object of the present invention is to provide an electrical junction box able to prevent the heat generated by the electric component from concentrating on the printed wiring board even when the overlapping direction of the upper and lower covers is along the vertical direction, and the printed wiring board is positioned above the electric component.

Solution to Problem

For achieving the object, according to a first aspect of the present invention, there is provided an electrical junction box including: a printed wiring board of which a surface is arranged along a horizontal direction; an electric component mounted on the surface of the printed wiring board, and arranged lower than the printed wiring board; an upper cover covering the printed wiring board, and arranged upper than the printed wiring board; a hole opening on a surface of an outer wall of the upper cover arranged parallel to the printed wiring board; and a heat-introducing wall continued to an inner edge of the hole, and penetrating the printed wiring board.

According to a second aspect of the present invention, there is provided the electrical junction box according to the first aspect, wherein the heat-introducing wall is provided on a whole circumference of the inner edge of the hole.

According to a third aspect of the present invention, there is provided the electrical junction box according to the first or second aspect, further including a lower cover overlapped with a lower side of the upper cover along a direction perpendicular to the printed wiring board, and attached to the upper cover, said lower cover being provided with a through-hole opening on the surface of the outer wall arranged parallel to the printed wiring board.

According to a fourth aspect of the present invention, there is provided the electrical junction box according to any one of the first to third aspects, further including: a heat-insulating layer provided on the surface on which the electric component is mounted of the printed wiring board.

According to the electrical junction box of the first aspect of the present invention, the hole is provided on the outer wall of the upper cover arranged upper than the printed wiring board, and the heat-introducing wall extended vertically from the inner edge of the hole, and penetrating the printed wiring board is provided. Therefore, the heat generated by the electric component mounted on the printed wiring board is guided to the hole by the heat-introducing wall.

According to the electrical junction box of the second aspect of the present invention, because the heat-introducing wall is provided on a whole circumference of the inner edge of the hole, the heat generated by the electric component mounted on the printed wiring board is surely guided to the hole by the heat-introducing wall.

According to the electrical junction box of the third aspect of the present invention, because the through-hole penetrating the outer wall of the lower cover is provided, liquid such as water entering the cover is discharged out of the cover via the through-hole.

According to the electrical junction box of the fourth aspect of the present invention, because the heat-insulating layer is provided on the surface of the printed wiring board on which the electric component is mounted, heat generated by the electric component mounted on the printed wiring board is prevented from being transmitted to the printed wiring board.

Advantageous Effects of Invention

As explained above, according to the first aspect of the present invention, because the heat generated by the electric component mounted on the printed wiring board is guided into the hole by the heat-introducing wall, the heat is prevented from being transmitted to the printed wiring board. Therefore, the heat generated by the electric component is prevented from concentrating on the printed wiring board even when the overlapping direction of the upper and lower covers is along the vertical direction, and the printed wiring board is positioned above the electric component.

According to the second aspect of the present invention, because the heat generated by the electric component mounted on the printed wiring board is surely guided to the hole by the heat-introducing wall, the heat is surely prevented from being transmitted to the printed wiring board. Therefore, the heat generated by the electric component is surely prevented from concentrating on the printed wiring board even when the overlapping direction of the upper and lower covers is along the vertical direction, and the printed wiring board is positioned above the electric component.

According to the third aspect of the present invention, because liquid such as water entering the cover is discharged out of the cover via the through-hole, the liquid is prevented from adhering to the printed wiring board.

According to the fourth aspect of the present invention, heat generated by the electric component mounted on the printed wiring board is prevented from being transmitted to the printed wiring board. Therefore, the heat generated by the electric component is further surely prevented from concentrating on the printed wiring board even when the overlapping direction of the upper and lower covers is along the vertical direction, and the printed wiring board is positioned above the electric component.

These and other objects, features, and advantages of the present invention will become more apparent upon reading of the following detailed description along with the accompanied drawings.

DESCRIPTION OF EMBODIMENTS

Hereinafter, an electrical junction box according to an embodiment of the present invention will be explained in detail with reference to FIGS. 1 to 4. The electrical junction box 1 shown in FIG. 1 according to this embodiment is mounted on a vehicle as a moving object.

Figure 1:
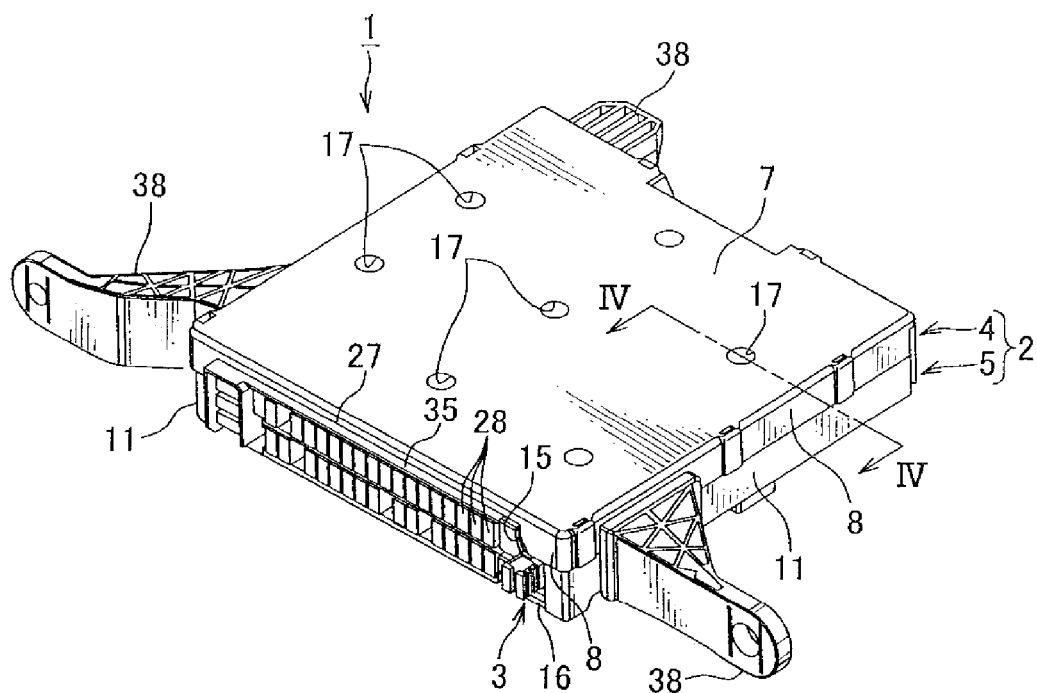
FIG. 1 is a perspective view showing an electrical junction box according to an embodiment of the present invention.
Figure 3:
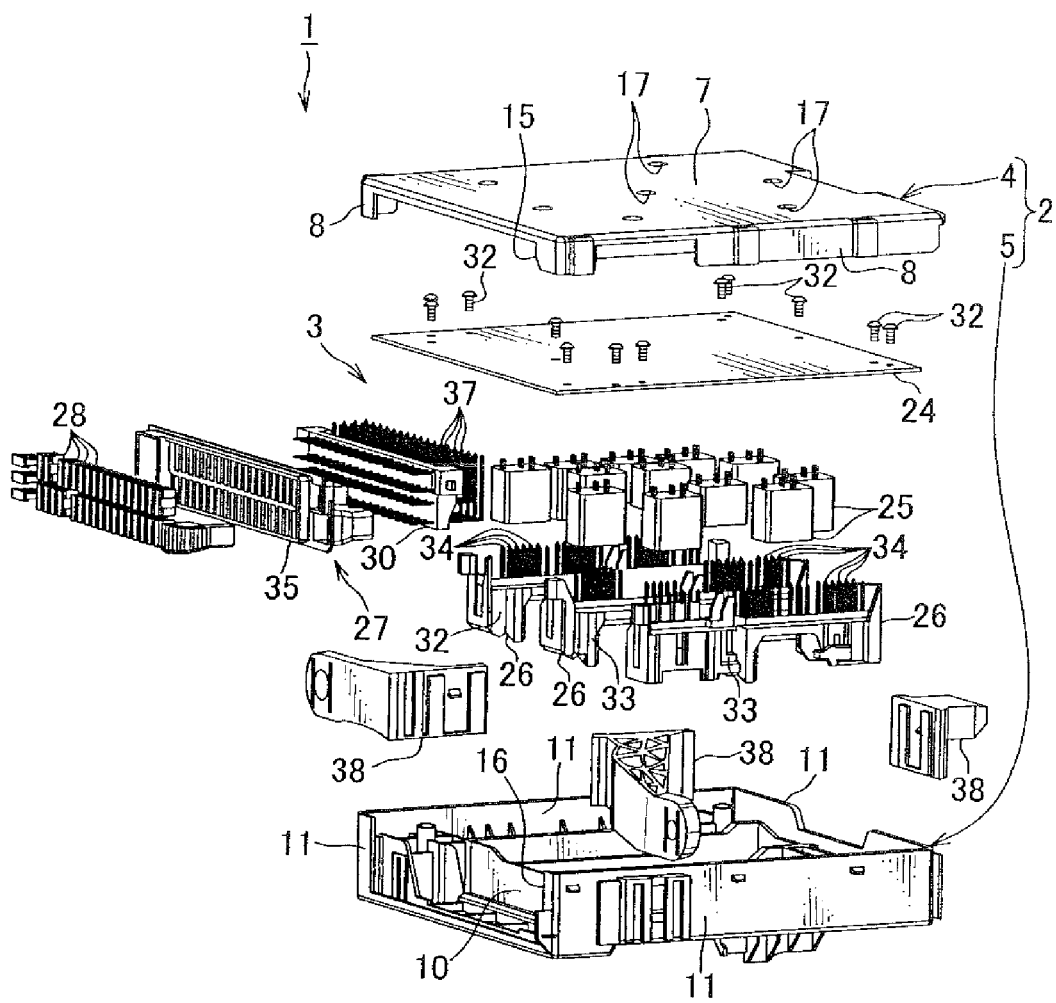
FIG. 3 is an exploded perspective view showing the electrical junction box shown in FIG. 1.

As shown in FIGS. 1 and 3, the electrical junction box 1 includes: a box main body 2; and electric-power-distributing unit 3 (shown in FIG. 3). Incidentally, in this embodiment, an overlapping direction of an upper cover 4 and a lower cover 5 of the box main body 2 is referred to as a thickness direction Z, a direction crossing the thickness direction Z (orthogonal direction) and an arranging direction of a later-described plurality of fuses 28 is referred to as a width direction X, and a crossing direction (orthogonal direction) both to the thickness direction Z and to the width direction X is referred to as a longitudinal direction Y.

Figure 2:
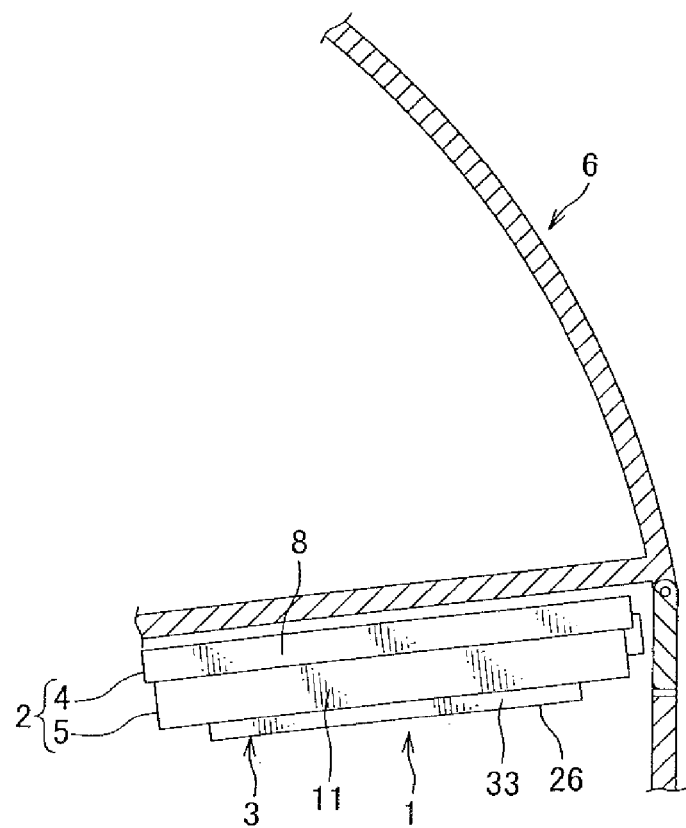
FIG. 2 is an explanatory view showing a state that the electrical junction box shown in FIG. 1 is attached to a vehicle.

In the electrical junction box 1 of this embodiment, the thickness direction Z is substantially parallel to a vertical direction. As shown in FIG. 2, the electrical junction box 1 is attached to a lower portion of a center console of a vehicle. Incidentally, in FIG. 2, the thickness direction Z is slightly inclined so that the electrical junction box 1 is gradually extended downward as extended forward of the vehicle, and the upper cover 4 is overlapped with an upper side of the lower cover 5 along a direction perpendicular to a surface of a later-described metallic substrate 24.

The box main body 2 is formed in a flattened box shape, and includes: the upper cover 4; and the lower cover 5 configured to be overlapped with each other. The upper and lower covers 4, 5 are made of insulating synthetic resin, and molded by well-known injection molding.

Figure 4:
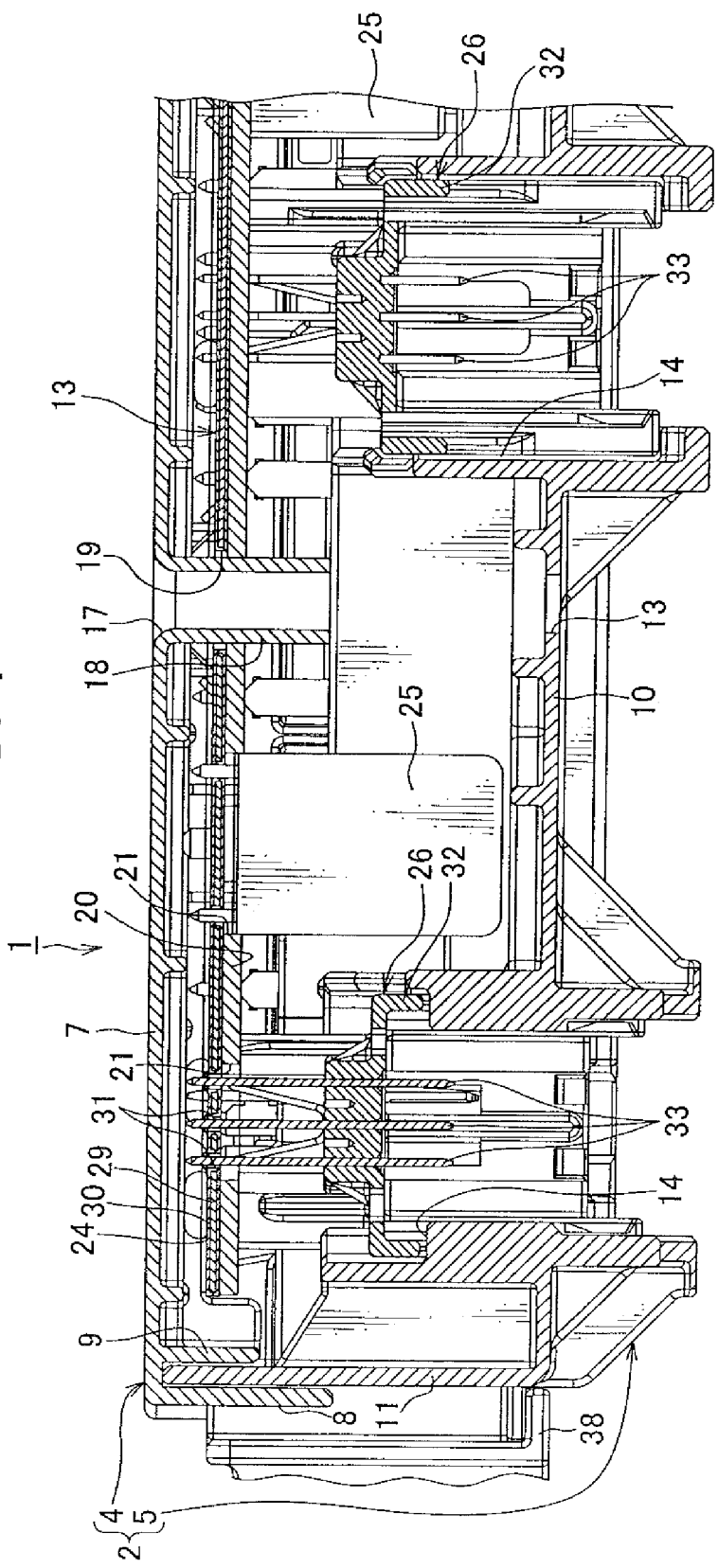
FIG. 4 is a sectional view taken on line IV-IV in FIG. 1.

The upper cover 4 includes: a substantially flat ceiling wall 7 as an outer wall; four peripheral walls 8 respectively extended vertically from outer edges of the ceiling wall 7; and an inner wall 9 (shown in FIG. 4). The ceiling wall 7 is arranged parallel to the later-described metallic substrate 24 of the electric-power-distributing unit 3. The inner wall 9 is arranged inside of the peripheral walls 8, and extended vertically from the ceiling wall 7. The inner wall 9 is arranged parallel to the peripheral walls 8 with a gap, and provided on substantially a whole circumference of outer edges of the ceiling wall 7 of the upper cover 4.

The lower cover 5 includes: a substantially flat bottom wall 10 as an outer wall; and four peripheral walls 11 respectively extended vertically from outer edges of the bottom wall 10. The bottom wall 10 is arranged parallel to the later-described metallic substrate 24 of the electric-power-distributing unit 3. The bottom wall 10 is provided with a hole 14 (shown in FIG. 4) for exposing a later-described connector 26.

Front side peripheral walls 8, 11 in FIGS. 1 and 3 of each four peripheral walls 8, 11 of the upper and lower covers 4, 5 are provided with notches 15, 16 for exposing a later-described fuse plate 35 and fuses 28 attached to the fuse plate 35.

The upper and lower covers 4, 5 are assembled with each other in a manner that the ceiling wall 7 and the bottom wall 10 are arranged parallel to each other with a gap, and the outer edges of the peripheral walls 8 are overlapped with outsides of the outer edges of the peripheral walls 11. At this time, the inner wall 9 is overlapped with inner surfaces of the peripheral walls 11 of the lower cover 5. In this embodiment, the lower cover 5 is provided with a locking projection, and the upper cover 4 is provided with a locking step.

The above upper and lower covers 4, 5 are assembled with each other (attached to each other) when the locking projection and locking step are locked with each other. When the upper and lower covers 4, 5 are assembled with each other, the upper cover 4 covers the metallic substrate 24, and is provided above the metallic substrate 24, and the lower cover 5 is arranged below the upper cover 4 along a direction perpendicular to the surface of the metallic substrate 24.

Further, as shown in FIG. 4, the upper cover 4 is provided with a hole 17 and a heat introducing tube 18 as a heat introducing wall, and the lower cover 5 is provided with a through-hole 13. A plurality of holes 17 penetrates the ceiling wall 7, and is arranged with a gap to each other. Namely, the hole 7 is opened on a surface of the ceiling wall 7. The heat introducing tube 18 is provided on a whole circumference of an inner edge of the hole 17. The heat introducing tube 18 is extended vertically from an inner edge of the hole 17 toward the bottom wall 10, and inserted into a hole 19 provided on the metallic substrate 24 (penetrating the metallic substrate 24). A tip of the heat introducing tube 18 furthest away from the ceiling wall 7 is arranged nearer the bottom wall 10 than the metallic substrate 24. The heat introducing tube 18 guides a heated air in the box main body 2 to the hole 17.

A plurality of through-holes 13 penetrates the bottom wall 10, and is arranged with a gap to each other. Namely, the through-hole 13 penetrates the surface of the bottom wall 10. In this embodiment, the through-hole 13 is arranged lower than the hole 17 in a vertical direction. Incidentally, according to the present invention, the through-hole 13 and the hole 17 are not necessarily arranged in the thickness direction Z.

As shown in FIG. 3, the electric-power-distributing unit 3 includes: the metallic substrate 24 as a printed wiring board; a relay 25; a plurality of connectors 26; a fuse holding portion 27; and a plurality of fuses 28 as a plurality of electric components.

As shown in FIG. 4, the metallic substrate 24 includes: a metallic plate 29 made of aluminum alloy, copper alloy or the like; an insulating plate 30 in which the metallic plate 29 is embedded and made of insulating synthetic resin; and a not-shown conductive pattern formed on an outer surface of the insulating plate 30. Further, as shown in FIG. 4, the metallic substrate 24 is provided with a plurality of through-holes 31 penetrating through both surface of the metallic substrate 24. An inner wall of the through-hole 31 is covered by the synthetic resin composing the insulating plate 30. The conductive pattern of the metallic substrate 24 electrically connects terminals of the connector 26 with a relay 25 and fuses 28 according to a predetermined pattern. The metallic substrate 24 is received in the covers 4, 5 in a manner that the metallic substrate 24 is separated from both the ceiling wall 7 and the bottom wall 10, and arranged parallel to them. The metallic substrate 24 is fixed to the lower cover 5, namely, the box main body 2 with a screw 32 screwed into a boss provided on the lower cover 5. Thus, the metallic substrate 24 is received in the lower cover 5, namely, the box main body 2, and the surface of the metallic substrate 24 is arranged along a horizontal direction. Incidentally, in the present invention, when an angle between the surface of the metallic substrate 24 and the horizontal direction is in a range of zero to several dozens degrees, it is defined that the surface of the metallic substrate 24 is arranged along the horizontal direction.

The relay 25 is mounted on the metallic substrate 24, and the terminals of the relay 25 are connected to the conductive pattern of the metallic substrate 24. The relay 25 is mounted on a surface facing the bottom wall 10 of the metallic substrate 24. Namely, the relay 25 is provided lower than the metallic substrate 24. The connector 26 includes: an insulating connector housing 33; and a plurality of conductive terminals 34. The connector housing 33 is attached to the metallic substrate 24, and exposed outside of the lower cover 5, namely, outside of the box main body 2 via the hole 14 penetrating the bottom wall 10. The terminals 34 are held in the connector housing 33 and connected to the conductive pattern of the metallic substrate 24. One connector 26 of the plurality of connectors 26 is fitted with a connector attached to an end of a power source cable connected to a power source of a vehicle. The other connectors 26 are fitted with connectors attached to ends of a wiring harness connected to various electronic devices in the vehicle.

As shown in FIG. 3, the fuse holding portion 27 includes: a fuse plate 35; a fuse terminal holder 36; and a plurality of conductive terminals 37. The fuse plate 35 is made of insulating synthetic resin, and a plurality of fuses 28 are attached to the fuse plate 35. The fuse plate 35 is attached to the covers 4, 5 in a manner to close the notches 15, 16 of the upper and lower covers 4, 5 and to expose the fuses 28. The fuse terminal holder 36 is made of insulating synthetic resin, and attached to the fuse plate 35.

Further, the terminals 37 are held in the fuse terminal holder 36, and connected to the fuses 28 attached to the fuse plate 35. The terminals 37 are connected to the conductive pattern of the metallic substrate 24. The terminals 37 of the fuse terminal holder 36 are connected to the conductive pattern of the metallic substrate 24, and the fuse terminal holder 36 is mounted on the metallic substrate 24. The fuses 28 are attached to the fuse plate 35 of the fuse holding portion 27.

The electric-power-distributing unit 3 described above distributes the electric power from the power source via the conductive pattern of the metallic substrate 24 and via the fuses 28 and the relay 25 to the electronic devices. Further, a heat-insulating layer 20 is provided on a surface on which the relay 25 is mounted of the metallic substrate 24 of the electric-power-distributing unit 3. A thickness of the heat-insulating layer 20 is constant, and the heat-insulating layer 20 is provided with insertion holes 21 for inserting the terminals 34 of the connector 26 and the relay 25. The heat-insulating layer 20 is made of well-known insulating material.

Further, the above electrical junction box 1 includes a plurality of brackets 38 for fixing the upper and lower covers 4, 5, namely the box main body 2 to a vehicle body.

According to this embodiment, the hole 17 is provided on the ceiling wall 7 of the upper cover 4 provided above the metallic substrate 24, and the upper cover 4 is provided with the heat introducing tube 18 extended vertically from the inner edge of the hole 17 and penetrating the metallic substrate 24. Therefore, the heat generated by the relay 25 mounted on the metallic substrate 24 is guided to the hole 17 by the heat introducing tube 18. Therefore, the heat is prevented from being transmitted to the metallic substrate 24. Therefore, the heat generated by the relay 25 is prevented from concentrating on the metallic substrate 24 even when the overlapping direction of the upper and lower covers 4, 5 is along the vertical direction, and the metallic substrate 24 is positioned above the relay 25.

Because the heat introducing tube 18 is provided on a whole circumference of the inner edge of the hole 17, the heat generated by the relay 25 mounted on the metallic substrate 24 is surely guided to the hole 17 by the heat introducing tube 18. Therefore, the heat is surely prevented from being transmitted to the metallic substrate 24. Therefore, the heat generated by the relay 25 is surely prevented from concentrating on the metallic substrate 24 even when the overlapping direction of the upper and lower covers 4, 5 is along the vertical direction, and the metallic substrate 24 is positioned above the relay 25.

Because the through-hole 13 penetrating the bottom wall 10 of the lower cover 5 is provided, liquid such as water entering the covers 4, 5, namely the box main body 2 is discharged out of the covers 4, 5, namely the box main body 2 via the through-hole 13. Therefore, the liquid is prevented from adhering to the metallic substrate 24.

Because the heat-insulating layer 20 is provided on the surface of the metallic substrate 24 on which the relay 25 is mounted, heat generated by the relay 25 mounted on the metallic substrate 24 is prevented from being transmitted to the metallic substrate 24. Therefore, the heat generated by the relay 25 is further surely prevented from concentrating on the metallic substrate 24 even when the overlapping direction of the upper and lower covers 4, 5 is along the vertical direction, and the metallic substrate 24 is positioned above the relay 25.

In the above embodiment, the metallic substrate 24 is used as the printed wiring board. However, according to the present invention, so-called printed circuit board made by forming a conductive pattern on an outer surface of an insulating substrate made of insulating synthetic resin may be used as the printed wiring board.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

REFERENCE SIGNS LIST

1 electrical junction box
4 upper cover
5 lower cover
7 ceiling wall (outer wall)
10 bottom wall (outer wall)
13 through-hole
17 hole
18 heat-introducing tube (heat introducing wall)
20 heat-insulating layer 20
24 metallic substrate (printed wiring board)
25 relay (electric component)

What is claimed is:

1. An electrical junction box comprising:
   a printed wiring board of which a surface is arranged along a horizontal direction;
   an electric component mounted on the surface of the printed wiring board, and arranged lower than the printed wiring board in a vertical direction;
   an upper cover covering the printed wiring board, and arranged over the printed wiring board;
   a hole, opening on a surface of an outer wall of the upper cover, penetrating the upper cover, and arranged parallel to the printed wiring board; and
   a heat-introducing wall integrally formed with the upper cover, continued to an inner edge of the hole formed on an inner surface of the upper cover, and penetrating the printed wiring board for guiding heat generated by the electric component into the hole.

2. The electrical junction box as claimed in claim 1, wherein the heat-introducing wall is provided on a whole circumference of the inner edge of the hole.

3. The electrical junction box as claimed in claim 1, further comprising: a lower cover overlapped with a lower side of the upper cover along a direction perpendicular to the printed wiring board, and attached to the upper cover, said lower cover being provided with a through-hole opening on the surface of an outer wall of the lower cover arranged parallel to the printed wiring board.

4. The electrical junction box as claimed in claim 2, further comprising: a lower cover overlapped with a lower side of the upper cover along a direction perpendicular to the printed wiring board, and attached to the upper cover, said lower cover being provided with a through-hole opening on the surface of the outer wall arranged parallel to the printed wiring board.

5. The electrical junction box as claimed in claim 1, further comprising: a heat-insulating layer provided on the surface on which the electric component is mounted on the printed wiring board.

6. The electrical junction box as claimed in claim 2, further comprising: a heat-insulating layer provided on the surface on which the electric component is mounted on the printed wiring board.

7. The electrical junction box as claimed in claim 3, further comprising: a heat-insulating layer provided on the surface on which the electric component is mounted on the printed wiring board.

8. The electrical junction box as claimed in claim 4, further comprising: a heat-insulating layer provided on the surface on which the electric component is mounted on the printed wiring board.

9. The electrical junction box as claimed in claim 1, wherein a tip of the heat-introducing wall furthest away from the outer wall of the upper cover is arranged closer to the lower cover than the printed wiring board.

* * * * *